United States Patent [19]

Evans et al.

[11] Patent Number: 4,903,024

[45] Date of Patent: Feb. 20, 1990

[54] A/D CONVERTER SYSTEM WITH ERROR CORRECTION AND CALIBRATION APPARATUS AND METHOD

[75] Inventors: William P. Evans, Glen Burnie; Thomas K. Lisle, Jr., Baltimore, both of Md.

[73] Assignee: Westinghouse Electric Corp., Pittsburgh, Pa.

[21] Appl. No.: 111,765

[22] Filed: Oct. 23, 1987

[51] Int. Cl.⁴ .............................................. H03M 1/10
[52] U.S. Cl. ................................... 341/120; 341/121; 341/122; 341/118
[58] Field of Search ............... 341/110, 118, 120, 121, 341/122, 123, 124, 141, 142, 137, 165

[56] References Cited

U.S. PATENT DOCUMENTS

| | | |
|---|---|---|
| 4,227,183 | 10/1980 | Ninomiya . |
| 4,345,241 | 8/1982 | Takeuchi et al. ............... 341/118 |
| 4,364,027 | 12/1982 | Murooka ........................... 341/141 |
| 4,393,368 | 7/1983 | Rasmussen . |
| 4,535,319 | 8/1985 | Penney . |
| 4,559,523 | 12/1985 | Wakita . |
| 4,599,602 | 7/1986 | Matzuzawa et al. . |
| 4,608,555 | 8/1986 | Hoeft . |
| 4,612,533 | 9/1986 | Evans . |
| 4,618,850 | 10/1986 | Lenhoff, Jr. . |
| 4,709,225 | 11/1987 | Welland et al. ................. 341/121 |
| 4,736,189 | 4/1988 | Katsumata et al. ............. 341/120 |

Primary Examiner—William M. Shoop, Jr.
Assistant Examiner—Gary J. Romano
Attorney, Agent, or Firm—W. G. Sutcliff

[57] ABSTRACT

An analog to digital converter system is disclosed as comprising a conversion circuit operative for developing a digital output corresponding to the magnitude of an input analog signal, a calibration port arranged for receiving digital calibration data from an external source, adjustable calibration circuitry associated with the conversion circuit, and an adjustment mechanism for adjusting the calibration circuitry in response to data applied to the calibration port.

27 Claims, 2 Drawing Sheets

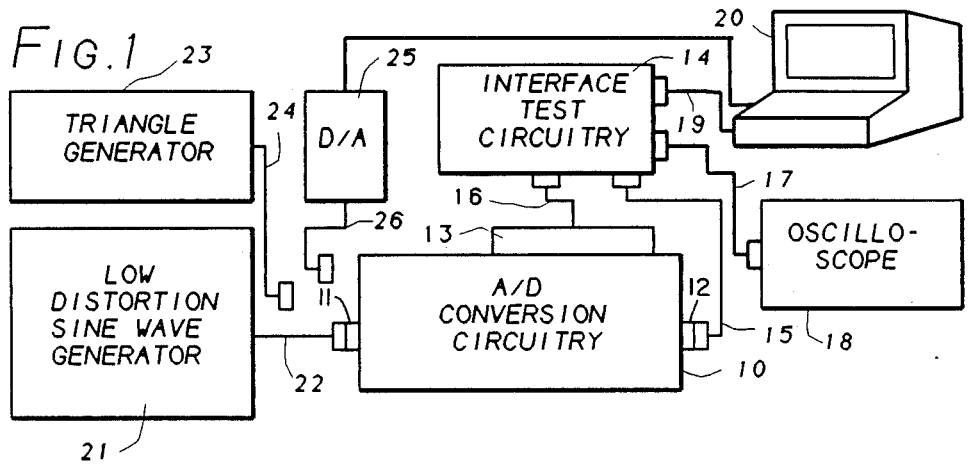
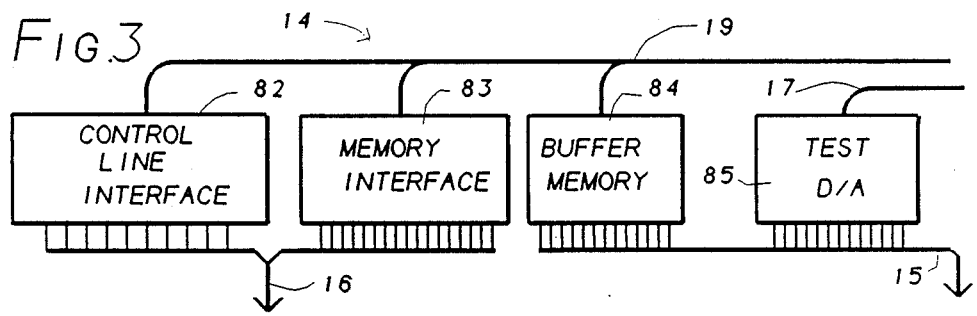
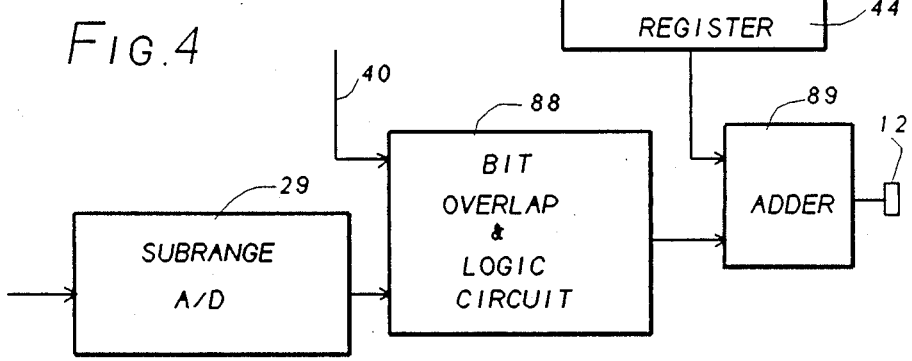

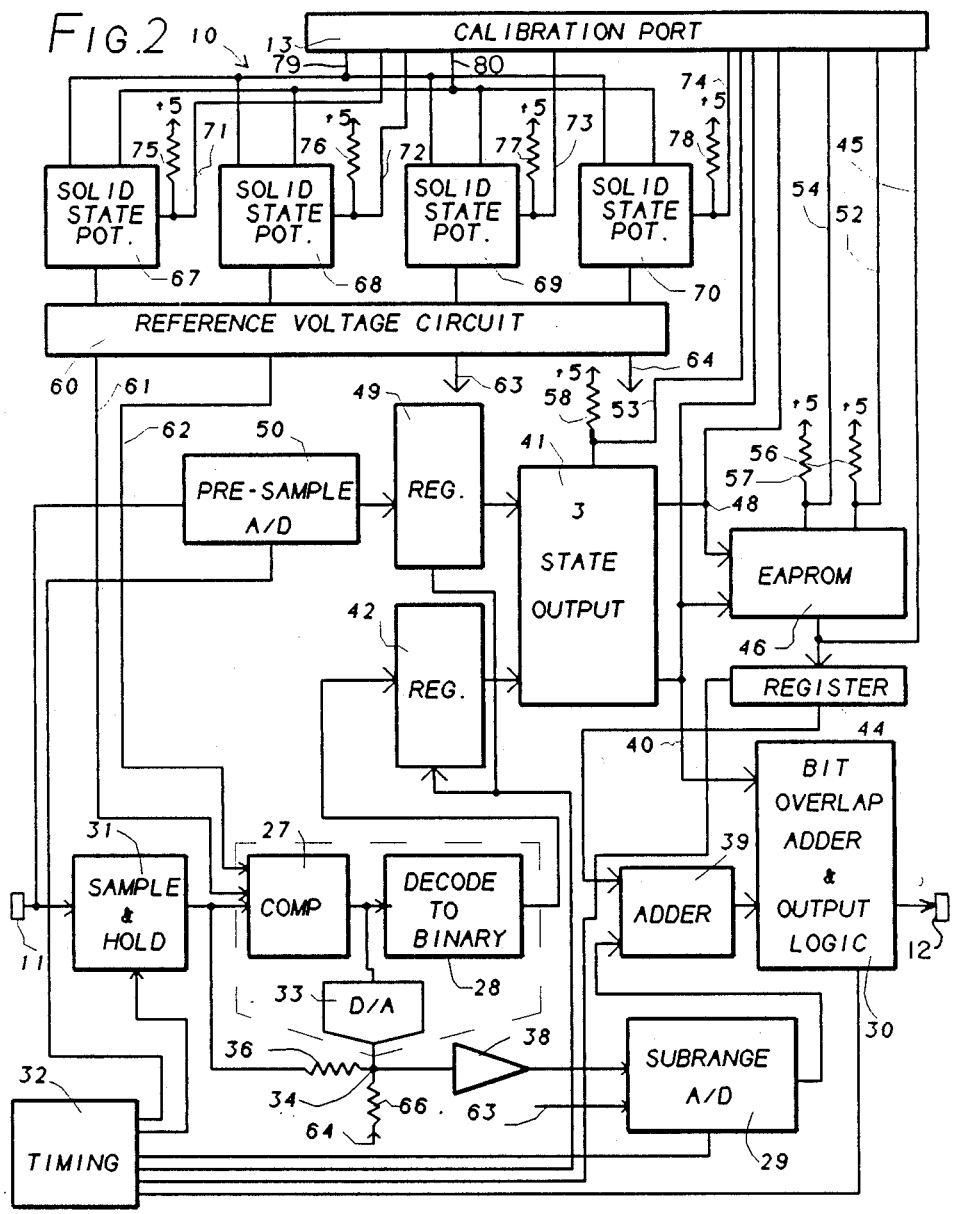

A/D CONVERTER SYSTEM WITH ERROR CORRECTION AND CALIBRATION APPARATUS AND METHOD

BACKGROUND OF THE INVENTION

1. Field of the Invention

This invention relates to an A/D converter system and more particularly to a system which has error correction and calibration apparatus incorporated therein and associated therewith and to methods of operation thereof. The converter system produces highly accurate and reliable results, operating at high speeds and with a high dynamic range, while the size, complexity and cost of manufacture of the system are minimized.

2. Description of the Prior Art

A number of improvements have been made in architectures of analog to digital converters to increase the speed and resolution of the conversions obtainable therefrom. One highly advantageous type converter has a subranging architecture in which digital signals obtained from main range and subrange A/D converters are logically combined to produce a digital output. The main range A/D converter, which is desirably a "flash" type of converter, operates to produce a digital signal which is a first approximation of the magnitude of an input analog signal. A subrange D/A converter, preferably a high speed precision converter, converts the digital signal so produced to an analog signal which is compared to the input analog signal to produce a difference signal which is applied to the subrange A/D.

With "half-flash" subranging architecture in which the main A/D converter is of the flash type, higher resolution conversion became possible but with limitations as to the obtainable speed and accuracy. Further improvements are obtainable with a microprocessor controlled correction system for reducing errors as disclosed in the Evans U.S. Pat. No. 4,612,533. In this system, a correction D/A converter supplies an analog correction signal to be summed with an analog signal from a subrange D/A and an input analog signal. The correction D/A converter is supplied with a digital signal from the data output of a RAM which is supplied with a control address signal derived through a digital multiplexer either from the digital output of a main range A/D converter or from the microprocessor. An analog multiplexer is controlled by the microprocessor to connect the input of an input sample and hold circuit either to an analog input or to the output of a low distortion sine wave oscillator. The microprocessor is operative to connect the input of an input sample and hold circuit through an analog multiplexer to a distortion sine wave oscillator and to then perform a FFT (Fast Fourier Transform) and to produce correction values which are stored in the RAM. Then the input of the sample and hold circuit is connected to an analog input while the stored correction values are accessed to apply digital signals to the correction D/A converter and to apply the analog correction signal.

With the microprocessor controlled error correction system, improved accuracy is obtainable and the subrange D/A converter and also the correction D/A converter need not be of expensive high precision types. However, the addition of the microprocessor and associated circuitry substantially increases the cost of manufacture of the system.

SUMMARY OF THE INVENTION

This invention was evolved with the general object of making further improvements in high speed analog to digital converters and particularly with regard to increasing the accuracy and speed with which conversions can be made and with regard to decreasing the cost of required components and the cost of manufacture of the converters.

Important aspects of the invention relate to the discovery and recognition of the sources of shortcomings and problems with systems which have heretofore been used or proposed.

In particular, the system of the aforementioned Evans patent requires an extra D/A converter as well as the RAM to produce the correction values and it is found that the RAM must be of a relatively expensive high speed, high power type. In accordance with an important feature of the invention, the correction is directly effected digitally rather than through the addition of an analog signal. The extra D/A converter is not used and in place of an expensive type of RAM, a memory component can be used which is a low cost type of RAM or ROM which may be of a programmable and non/volatile type such as an EAROM. The correction is implemented at less cost and less power is used.

In one arrangement, an adder adds the correction signal to the output of the subrange A/D converter and the adder output and the output of the main range A/D are applied to a bit overlap adder to produce the final output. In a second arrangement, output signals derived from the main range and subrange A/D converters are combined by a bit overlap adder while the output of the bit overlap adder and data output from the memory component are added in a correction adder, the final output being developed by the correction adder. The first arrangement is advantageous when only small linearity corrections are required, while the second will allow for a large range of correction values.

Another problem with the aforementioned microprocessor controlled correction system is that the microprocessor and associated circuitry are expensive and they increase the size of the converter and its power consumption, so as to make the converter unsuitable for many applications. Additional important features of the invention relate to the provision of a calibration port for receiving digital calibration data from an external calibration source which may include a standard small personal computer and interface and signal generating circuitry and components of the invention. Data applied to the port may include data to be transmitted to the aforementioned RAM or other memory component, operative to store calibration data and effect error correction.

In accordance with specific features, the applied digital calibration data may also include data for adjusting reference voltages including the reference voltages of a main range A/D converter, for example, and reference voltages for controlling offsets and subrange gain. Solid state potentiometers are usable to establish such reference voltages.

With these features, the size, complexity and cost of the converter is greatly reduced while its performance is enhanced, especially with respect to accuracy and reliability. Moreover, periodic testing is facilitated and the operation of converters can be readily monitored and recorded, to obtain accurate adjustments and to detect and correct any malfunctions which may occur.

A further problem with prior systems, including the aforementioned microprocessor controlled correction system, is that it is found that the system may produce substantial errors even when properly adjusted and operated. In research as to the causes of errors, it is found that substantial errors may result during dynamic conditions when there is a high rate of change of the input analog signal and that the system of the aforementioned Evans patent does not take dynamic errors into account. It deals only with a first series of terms of the transfer function which relate only to static conditions and does not deal with a second series of terms which relate to dynamic conditions. Mathematical models for dealing with the problem of dynamic errors have been proposed, but they would require use of a very large error correction array, a very long time to generate calibration data and an excessive amount of hardware to implement the functions defined by the models.

Further important features of the invention relate to the provision of means for obtaining dynamic error correction while minimizing the components and circuitry required and permitting rapid computation of calibration data. In brief, a system is provided which is operative to obtain a good approximation of the first time derivative of the analog signal, from which the required error correction is obtained, using calibration data as to the coefficients for the fundamental term and the most significant harmonic terms. The number of required components and the required circuitry are minimized while, at the same time, highly accurate results are obtained.

A process is provided for calibrating the system, wherein a low frequency sine wave is first applied to obtain the coefficients for static correction, as disclosed in the aforementioned Evans patent, and the system is calibrated for the static or low frequency nonlinearities. Then a full scale sine wave is applied at a higher frequency near the Nyquist rate where frequency dependent harmonics are clearly evident, and a FFT (Fast Fourier Transform) is used to obtain the coefficients for harmonics. To limit calibration time requirements, only the coefficients for the second and third harmonics may be determined and stored, it being found experimentally that they are the only harmonics which are significant in many high resolution A/D converters. However, coefficients for higher order harmonics may be determined, stored and used, using the principles of the invention.

The dynamic error correction systems and methods of the invention have very important advantages in that with a small number of additional components, the spurious free dynamic range of converter can be significantly increased over a wide frequency bandwidth. Only a small calibration table is required and the calibration data memory required to correct for both static and dynamic errors is minimized.

This invention contemplates other objects, features and advantages which will become more fully apparent from the following detailed description taken in conjunction with the accompanying drawings.

BRIEF DESCRIPTION OF THE DRAWINGS

FIG. 1 is a schematic diagram showing an A/D converter of the invention and calibration equipment of the invention connected thereto;

FIG. 2 is a schematic diagram of the A/D converter shown in block form in FIG. 1;

FIG. 3 is a schematic diagram of interface circuity of the calibration equipment of FIG. 1; and FIG. 4 is a schematic diagram showing a modification of the A/D converter as shown in FIG. 2.

DESCRIPTION OF PREFERRED EMBODIMENTS

Reference numeral 10 generally designates an A/D converter which is constructed in accordance with the principles of this invention and which includes an input port 11, an output port 12 and a calibration port 13. The converter 10 is shown connected to calibration equipment which includes interface test circuitry 14 connected through cables 15 to the output port 12, through a cable 16 to the calibration port 13, through a cable 17 to an oscilloscope 18 and through a cable 19 to a computer 20. A low distortion sine wave oscillator 21 is connectable through a cable 22 to the input port 11 for certain calibration procedures and a triangle generator 23 is connectable through a cable 24 to port 11 for other calibration procedures. A D/A converter circuit 25, connected to the computer 20, is optionally usable for applying triangle wave, sine wave or other analog signals to the input port 11 through a cable 26, as shown.

In calibration procedures which are described in detail hereinafter, the computer 20 is usable to effect adjustment of non-volatile solid state potentiometers in the converter 10 to control certain parameters. Then with the triangle generator 23 connected to the input port 11, initial calibration values in an electrically alterable memory of the converter 10 may be adjusted using the computer keyboard while observing the screen of the oscilloscope 18. Alternatively, the initial calibration values may be set automatically by the computer 20, with the D/A converter 25 connected through the cable 26 to the input port 11 to apply an analog signal thereto.

After such initial calibration procedures, the sine wave oscillator 21 is connected through the cable 22 to the input port 11 and calibration procedures are performed which include fast Fourier transforms by the computer 20 and which generate calibration data to be loaded into the electrically alterable memory of the converter 10, such data being thereafter used in the operation of the converter to minimize errors.

The converter 10 as illustrated in the schematic block diagram of FIG. 2 has a half-flash subranging architecture and includes a main range A/D converter, which is formed by a comparator circuit 27 and a decode to binary circuit 28, and a subrange A/D converter 29. Binary coded digital signals derived from such converters are combined in a bit overlap adder and output logic circuit 30 to develop a digital output at the output port 12. An analog signal at the input port 11 is applied to a sample and hold circuit 31 which is supplied with a clock signal to develop an output which is applied to the comparator circuit 27. Comparator circuit 27 includes a plurality of latched comparators, e.g. thirty-two comparators, which operate in response to an applied clock signal to compare the magnitude of the applied analog signal with a series of reference voltage levels supplied in steps of uniform magnitude, by a string of resistors connected to a reference voltage source. A timing circuit 32 supplies clock signals to various circuits including the comparator circuit 27, the subrange A/D converter, the output logic circuit 30, the sample and hold circuit 31 and other circuits of the converter 10 as shown.

In the illustrated embodiment, the comparator circuit 27 is connected to a D/A circuit 33 which may include thirty two current sources controlled by the comparators of the circuit 27 and connected to a summing node 34 which is coupled through a resistor 36 to the output of the sample and hold circuit 31. A voltage is developed at the summing node 34 which corresponds to the difference between the amplitude of the input analog signal and a signal proportional to the number of reference voltage levels which are exceeded by the input analog signal.

The difference signal developed at the summing node 34 is applied to the input of an operational amplifier 38, the output of which is applied to the subrange A/D converter 29 operative to develop digital signals which are applied to one input of an adder 39. The output of adder 39 is applied to one input of the bit overlap adder and output logic circuit 30. A second input of the circuit 30 is connected to a bus 40 which, except during calibration, is connected through a tri-state output circuit 41 to the output of a register 41 which is coupled to the output of the decode to binary circuit 28 of the main range A/D converter.

In the operation of the circuitry as thus far described, the main range A/D converter which includes the thirty two comparators of circuit 27 develops a 5 bit binary coded digital signal at the output of circuit 28, applied through register 42, output circuit 41 and bus 40 to the output logic circuit 30. The signal so applied corresponds to the five most significant bits of the digital output. The subrange A/D converter 29 develops a digital signal corresponding to the least significant bits. For a ten bit converter and with the main range converter having a bit capacity of five, the subrange converter must have a bit capacity of at least five. Preferably it has a greater capacity, e.g. eight, to provide a bit overlap and to insure accurate and reliable conversions.

Important features of the invention relate to the generation of digital error correction signals which are applied from a register 44 to a second input of the adder 39, in the embodiment of FIG. 2. When the converter 10 is being calibrated, the register 44 is supplied with data through a bus 45 from the calibration port 13. After calibration, the register 44 is supplied with data from a data port of a memory component 46 which is electrically alterable and which is illustrated as being an EAPROM but which may be any equivalent type of component.

The memory component includes address lines connected to the bus 40 and additional address lines connected to a bus 48 which is connectable through the tri-state output circuit 41 to a register 49 which is connected to the output of a pre-sample A/D circuit 50, the input of which is connected to the input port 11. Circuit 50 may have a configuration similar to that provided by the sample and hold circuit 31 and the main range A/D converter which includes the comparators 27 and the decode to binary circuit 28. It is supplied with a clock signal from the timing circuit 32 at a time preceding the clock signal applied to the sample and hold circuit 31 and it develops a corresponding digital output, for example a five bit output, which is applied through register 49 and output circuit 41 to the pre-sample bus 48.

Thus the address data supplied to the memory component 46 includes the data on the main range A/D bus and data on the pre-sample A/D bus 48. Each possible combination of main register and pre-sample data thereby develops a unique set of address data, to effect output of data from the memory component in accordance with correction data stored therein.

Calibration data may be loaded into the memory component through connections of the address buses 40 and 48 to the calibration port 13. A control signal is applied to a write line 52 to allow loading of data which is accomplished by sequentially applying address signals to the main range and pre-sample buses 40 and 48 and applying correction data signals to the data bus 45. At the same time a signal is applied to a control line 53 of the tristate output circuit 41 to prevent application of signals to the address lines 40 and 48 from the registers 42 and 49.

During computation of certain calibration data, prior to loading thereof into the memory component 46, a disabling signal may be applied to a control line 54 of the memory component 46, to prevent it from applying correction signals, and the disabling signal to the line 53 is removed to allow operation of the output circuit 41, the converter 10 being then operative and in a mode in which no correction data is applied through adder 39 to the output logic circuit 30. When the cable 16 is disconnected from the calibration port, a +5 volt signal is applied through resistors 56, 57 and 58 to the lines 52, 53 and 54, for normal operation of the converter with correction signals being then developed by the memory component and applied through register 44 and adder 39 to the output logic circuit 30.

In accordance with additional important features of the invention, reference voltage circuitry 60 is provided for applying reference voltages to lines 61–64, lines 61 and 62 being operative to supply reference voltages to the comparator circuit 27, line 63 being connected to the subrange A/D to control its gain and line 64 being connected through a resistor 66 to the summing node 34 to apply an offset voltage thereto and to the input of amplifier 38. The reference voltages on lines 61–64 are controlled by four solid state potentiometers 67–70 which have control lines 71–74 connected to the calibration port and also connected through resistors 75–78 to a +5 volt supply. An up-down control line 79 and an increment line 80 are connected to all four potentiometers 67–70. Each potentiometer is adjusted by applying an enabling signal to its individual control line and applying a signal to the line 79 to obtain up or down adjustment and then applying signals on the line 80 to increment the potentiometer in the desired direction. Once adjusted and with the cable 16 disconnected from the calibration port, the potentiometers 67–70 retain their adjustments indefinitely.

Although not shown, it will be understood that additional connections may be made from various circuit points to terminals of the calibration port for the purpose of measuring and automatically monitoring the voltages thereat during calibration.

FIG. 3 is a schematic diagram of the interface test circuitry 14 which includes a control line interface 82 for connection through the cable 16 and the calibration port 13 to the control lines 52–54 and 75–80 of the converter 10. A memory interface 83 is also provided for connection through the cable and the calibration port 13 to the address buses 40 and 48 and also to the data bus 45. In addition, a buffer memory 84 and a test D/A converter 85 are provided for connection through cable 15 to the output port 12 of the converter 10, the output of the D/A converter 85 being connectable through the cable 17 to the oscilloscope 18.

FIG. 4 illustrates a modification in which the output of the subrange A/D converter 29 is applied to a bit overlap adder and logic circuit 88 which is similar to the circuit 30 and which receives the main range digital signals applied through bus 40. The output of the circuit 88 is applied to one input of an adder circuit 89 the other input of which is connected to the register 44. Adder circuit 89 develops the digital output which is applied to the output port 12. Thus the correction signals are added after the adding of main range and subrange digital signals rather than being added to the subrange signals as in the embodiment of FIG. 2. This arrangement of FIG. 4 is more appropriate where the expected corrections may be a large fraction of a subrange; otherwise, the arrangement of FIG. 2 may be used to advantage.

In the calibration procedures, the computer 20 is usable to effect adjustment of each of the solid state potentiometers 67-70 by sending an enabling signal to the corresponding one of the control lines 71-74 and then sending incrementing signals on line 80 while sending a control signal on the up-down line 79 to control the direction of adjustment. Each adjustment may be effected until the desired reference voltage is obtained.

After adjustment of the reference voltages, an initial subrange transition adjustment is preferably effected. In a manual adjustment procedure, the triangle generator 23 is connected to the input port 11 through the cable 24 while the cable 16 is connected to the output port 12. Then correction data stored in the memory component may be initially adjusted to correct for any D/A converter inaccuracies which show up as differential linearity errors. This can be done manually by observing the output pattern on the screen of the oscilloscope 18, noting any discontinuities at transition points and loading appropriate data into the memory component at the addresses where the errors occur. Instead of a manual procedure, an automatic procedure may be used in which the D/A converter 25 is connected to the input port 1; through the cable 26 and is supplied with digital signals from the computer 20, the digital output of the converter 10 being sent through the cable 15 to the buffer memory 84 to be accessed by the computer to measure the response at the transition points.

The next step is to generate the calibration data which is required to correct for static errors. This is accomplished by applying a low frequency sine wave to the input port 11 while conducting an FFT (Fast Fourier Transfrom) on the output signal. The low frequency sine wave may be applied either through the oscillator 21 or automatically through the D/A converter 25. A memory disabling control signal is applied through the line 54 to the memory component 46, so that the digital output at the port 12 is not affected by any correction data stored in the memory component 46.

The mathematical analysis for the static error correction is set forth in the aforementioned Evans U.S. Pat. No. 4,612,533, the disclosure of which is incorporated herein by reference. Use is made of the fact that the values of the A's in the following series of expressions of the transfer function equation:

$$V_0 = A_0 + A_1 V + A_2 V^2 + A_3 V^3 + \ldots$$

can be solved for by injecting the low frequency pure sine wave into the A/D converter and conducting the FFT on the output. The amplitude and phase relationships of the calculated harmonic components are compared with the phase and amplitude of the fundamental and are used to determine the values of $A_0, A_1, A_2, \ldots$ The static correction procedure does not correct for dynamic errors. It does not take into account a second series of expressions of the the transfer function equation, as follows:

$$B_1 dv/dt + B_2 (dv/dt)^2 + B_3 (dv/dt)^3 + \ldots.$$

This second series of expressions is taken into account in the system of the invention. A very good approximation of dv/dt is obtainable through use of the pre-sample A/D converter 50 if the time between the presample and the main sample is kept small in relation to the overall A/D sample period T. If dv/dt is known, then $B_1$ can be determined, and if $B_2$ and $B_3$ can also be determined, the frequency dependent error can be determined with a high degree of accuracy. It has been determined experimentally that only the second and third harmonic are significantly frequency dependent in many high resolution A/D converters and an analysis for solving for $B_2$ and $B_3$ is given below, from which the analysis to solve for the higher order B coefficients will be apparent, if such is desired.

After solving for the A coefficients, they are loaded into the appropriate addresses locations of the memory component 46 which is then enabled and used during the dynamic error correction determinations. A full scale sine wave is then injected at a higher frequency near the Nyquist rate where the frequency dependent harmonics are clearly evident. The equation describing the A/D output is now (for $V_{in} = \sin \omega t$):

$$V_0 = A_1 \sin \omega t + B_1 \omega \cos \omega t + B_2 \omega^2 (\cos \omega t)^2 + B_3 \omega^3 (\cos \omega t)^3$$

Dropping the small offset and fundamental phase shift terms, the equation reduces to:

$$V_0 = A_1 \sin \omega t + (B_2/2) \omega^2 \cos 2\omega t + (B_3/4) \omega^3 \cos 3\omega t$$

Next, one can use the magnitude and phase of the harmonic terms found in the FFT to find the component of the harmonic vector in phase with the predicted dynamically induced harmonics:

$$H_2 = (B_2/2)\omega^2 \text{ and } H_3 = (B_3)\omega^3$$

Therefore, one can solve for $B_2$ and $B_3$:

$B_2 = 2H_2\omega^2$   $H_2$ = amplitude of 2nd harmonic $B_3 = 4H_3/\omega^3$   $H_3$ = amplitude of 3rd harmonic $\omega$ = input test frequency Thus, after the values of the A coefficients are determined from the low frequency calibration procedure and entered into the memory component 46, the values of the B coefficients are determined from the high frequency calibration procedures and corresponding data may then be entered into the memory component, at the appropriate addresses. It is noted that when $dv/dt=0$, the output of the pre-sample A/D converter 50 is equal to that of the main range converter and the data on the pre-sample data bus 48 is the same as that of the main range data bus 40, for each possible value of the data on the main range data bus 40. The memory locations for static error correction values are thus defined and the corresponding data may be entered into the memory component 46 at such locations to effect the static error corrections and to be usable while generating the dynamic or high frequency error correction data. After such data is generated, it may be entered into the address locations which correspond to all possible combinations of data on the main range and pre-sample data buses 40 and 48.

The invention thus provides dynamic as well as static error corrections, but with comparatively simple circuitry and with a minimum number of "on-board" components in the converter itself. The error correction is generated and applied digitally, no D/A converter being required. The error correction procedures are relatively simple and straight-forward and the time required to generate the correction values during the calibration procedures is minimized. The use of the calibration port 13 and separate equipment for calibration is, of course, high advantageous in minimizing the size, complexity and cost of manufacture of the converter.

It will be recognized that the invention is not necessarily limited to the exact form of architecture as disclosed and that modifications may be made. For example, dynamic error correction is highly advantageous in systems which require both high dynamic range and high band width but in cases in which such dynamic error correction is not deemed to be necessary, the pre-sample A/D converter 50 and associated components need not be used. The invention may be applied to converters having architectures differing from that illustrated, including, for example, architectures in which a delay line is interposed between the input sample and hold and the summing node or architectures in which other features are incorporated to improve speed and accuracy or otherwise improve performance.

It will be understood that other modifications and variations may be made without departing from the spirit and scope of the novel concepts of the invention.

We claim:

1. An analog to digital converter system comprising: conversion circuitry operative for developing a digital output corresponding to the magnitude of an input analog signal, a calibration port arranged for receiving digital calibration data from an external source, adjustable calibration means comprising adjustable reference voltage means comprised of solid state potentiometer means associated with said circuitry, and adjustment means for adjusting said calibration means in response to data applied to said calibration port, said adjustment means being operable for adjusting said adjustable reference voltage means.

2. An analog to digital converter system as defined in claim 1 wherein said conversion circuitry comprises input means for receiving said input analog signal, and an A/D converter including said adjustable reference voltage means for developing a series of reference voltage levels in steps of uniform magnitude, and a plurality of comparator means coupled to said input means and said reference voltage means and arranged to compare the magnitude of said input analog signal with said reference voltage levels to develop a number of comparator output signals equal to the number of reference voltage levels which are exceeded by the magnitude of said input analog signal.

3. An analog to digital converter system as defined in claim 1 wherein said calibration means comprises error correction means including means associated with said conversion circuitry for developing digital data which defines predetermined transitory characteristics of said input analog signal, and memory means for storing calibration data, said error correction means being arranged for applying correction signals to said conversion circuitry in accordance with a comparison of said calibration data and said characteristic-defining data.

4. An analog to digital converter system as defined in claim 3, said adjustment means being arranged for loading calibration data from said calibration port into said memory means.

5. An analog to digital converter system as defined in claim 3 wherein said memory means includes an address port and a data port, said error correction means being arranged to apply said characteristic-defining data to said address port for output from said data port of calibration data which corresponds to the applied characteristic-defining data.

6. An analog to digital converter system as defined in claim 3 wherein said conversion circuitry comprises input means for receiving said input analog signal, and an A/D converter including reference voltage means for developing a series of reference voltage levels in steps of uniform magnitude, said A/D converter further including a plurality of comparator means coupled to said input means and to said reference voltage means and arranged to compare the magnitude of said input analog signal with said reference voltage levels to develop a number of comparator output signals equal to the number of reference voltage levels which are exceeded by the magnitude of said input analog signal, said characteristic-defining data including data defining the number of comparator output signals which are developed.

7. An analog to digital converter system as defined in claim 3 wherein said calibration means further comprises adjustable reference voltage means associated with said conversion circuitry, said adjustment means being operable for adjusting said adjustable reference voltage means and being arranged for loading calibration data from said calibration port into said memory means.

8. An analog to digital converter system as defined in claim 3 wherein said correction signals are digital signals, said conversion circuitry including logic means for receiving said digital correction signals in a direction to reduce error in said digital output therefrom.

9. An analog to digital converter system as defined in claim 8 wherein said conversion circuitry includes a main range A/D converter for producing a digital output corresponding to a first approximation of said input analog signal, a D/A converter coupled to said main range A/D converter for developing a corresponding analog signal, means for producing a difference signal corresponding to a comparison of said analog signal from said D/A converter and said input analog signal, a subrange A/D converter for developing a digital signal corresponding to said difference signal, said logic means being arranged to receive signals derived from said main range and subrange A/D converters and to combine said signals with said digital correction signals.

10. An analog to digital converter system as defined in claim 9 wherein said logic means includes an adder for receiving and adding said correction signals and said signals derived from said subrange A/D converter, and an output logic circuit for receiving a signal from said adder and a signal derived from said main range A/D circuit.

11. An analog to digital converter system as defined in claim 3 wherein said conversion circuitry includes comparison means operative with respect to a certain sampling time for comparing the magnitude of said input analog signal with reference voltage levels, and wherein said characteristic-defining data include level-defining data determined by the highest of said reference voltage levels which is exceeded by said input analog signal.

12. An analog to digital converter system as defined in claim 11 wherein said correction signals are effectively added to the digital output in accordance with a comparison of said calibration data and said level-defining data to obtain a static error correction.

13. An analog to digital converter system as defined in claim 11 wherein said error correction means includes comparison means which are operative with respect to a presampling time preceding said sampling time of operation of said comparison means of said conversion circuitry and which are operative for comparing the magnitude of said input analog signal at said pre-sampling time with reference voltage levels, and wherein said characteristicdefining data include level-defining data determined by the highest of said reference voltage levels which is exceeded by said input analog signal at said pre-sampling time.

14. An analog to digital converter system as defined in claim 13 wherein said correction signals are effectively added to the digital output in accordance with a comparison of said calibration data and a comparison of said leveldefining data as determined at said pre-sampling and sampling times to obtain a dynamic error correction.

15. An analog to digital converter system as defined in claim 13, wherein said memory means includes an address port and a data port, said level-defining data as determined at said pre-sampling and sampling times being applied to said address port for output from said data port of a digital correction signal which corresponds to calibration data stored in said memory means at an address which corresponds to an address defined by the applied presampling and sampling level-defining data.

16. An analog to digital converter system as defined in claim 5, wherein said address and data ports are connected to said calibration port for simultaneously receiving address and data signals to store data in said memory means which is supplied from calibration source separate from said system.

17. An analog to digital converter system comprising: conversion circuitry operative for developing a digital output corresponding to the magnitude of an input analog signal, and error correction means associated with said conversion circuitry including means for developing digital data which defines predetermined transitory characteristics of said input analog signal, said error correction means being arranged to apply said characteristic-defining data to said address port for output from said data port of said digital correction signals which correspond to the applied characteristic-defining data, memory means including an address port and a data port for storing calibration data, and means for developing digital correction signals in accordance with a comparison of said calibration data and said characteristic-defining data, said conversion circuitry including logic means for receiving said digital correction signals in a direction to reduce error in said digital output therefrom and said conversion circuitry includes comparison means operative with respect to a certain sampling time for comparing the magnitude of said input analog signal with reference voltage levels, and wherein said characteristic-defining data include level-defining data determined by the highest of said reference voltage levels which is exceeded by said input analog signal.

18. An analog to digital converter system as defined in claim 17 wherein said digital correction signals are effectively added to the digital output in accordance with a comparison of said calibration data and said level-defining data to obtain a static error correction.

19. An analog to digital converter system comprising: conversion circuitry operative for developing a digital output corresponding to the magnitude of an input analog signal, and error correction means associated with said conversion circuitry including means for developing digital data which defines predetermined transitory characteristics of said input analog signal, memory means for storing calibration data, and means for developing correction signals in accordance with a comparison of said calibration data and said characteristic-defining data, said conversion circuitry including means for receiving said digital correction signals in a direction to reduce error in said digital output therefrom, said conversion circuitry further including a first A/D converter for developing first digital data corresponding to the amplitude of said input analog signal at a certain sampling time, a second A/D converter for developing second digital data corresponding to the amplitude of said input analog signal at a second sampling time different from said certain sampling time, said characteristic-data including both said first digital data and said second digital data.

20. An analog to digital converter system as defined in claim 19, wherein said memory means includes an address port and a data port, said first and second data being applied to said address port for output from said data port of a digital correction signal which corresponds to calibration data stored in said memory means at an address which corresponds to an address defined by said first and second data.

21. An analog to digital converter system as defined in claim 20, wherein said digital correction signal is effectively added to the digital output of said converter system to obtain static and dynamic error correction.

22. A method of analog to digital signal conversion, comprising the steps of: providing conversion circuitry having error correction circuits for including a memory having an address port which in normal operation is supplied with signals developed from an analog signal applied to an input port to develop an error correction signal to be effectively added at a digital output port in accordance with calibration data stored in the memory, providing a memory which is electrically alterable and a calibration port connected to address and data ports and a control line of the memory, testing the conversion circuitry to determine the relationship of the digital output to an applied analog signal and required error corrections and corresponding calibration data, then adjusting the conversion circuitry by applying digital data and a control signal through the calibration port to the address and data ports and control line of the electrically alterable memory to store the calibration data therein.

23. A method as defined in claim 22 wherein the testing and adjusting steps are performed by coupling a digital computer to the to the calibration and digital output ports to register the output data, generate the calibration data and apply the calibration data and control signal to the electrically alterable memory, and wherein the digital computer is then decoupled from the calibration and output ports for normal operation of the conversion circuitry.

24. A method analog to digital conversion comprising the steps of sampling an analog input signal at first and second sampling times one delayed with respect to the other to develop first and second analog signals, converting the first and second analog signals to first and second digital signals, supplying calibration data, developing a digital error correction signal from said first and second digital signals and said calibration data, and developing an output digital signal from said first digital signal and said error correction signal.

25. A method as defined in claim 24 including the steps of converting the first digital signal to a third analog signal, comparing the first and third analog signals to develop a subrange analog signal, and converting the subrange analog signal to a subrange digital signal, and adding the subrange digital signal to the first digital signal and the error correction signal in developing the output digital signal.

26. A method as defined in claim 24, wherein the sampling steps are perfomed periodically at a certain rate, the steps of applying an input analog test signal at a rate approaching said certain rate while developing digital test data from the digital output signal, generating calibration data from the digital test data, and using the generated calibration data in subsequent connversion operations.

27. A method as defined in claim 26, wherein the calibation data is generated from digital output data which includes data corresponding to at least the second and third harmonics of the applied input analog test signal.

* * * * *